(12) United States Patent
Eichfelder et al.

(10) Patent No.: US 11,316,067 B2
(45) Date of Patent: Apr. 26, 2022

(54) SEMICONDUCTOR BODY

(71) Applicant: OSRAM Opto Semiconductors GmbH, Regensburg (DE)

(72) Inventors: Marcus Eichfelder, Regensburg (DE); Alexander Walter, Laaber (DE)

(73) Assignee: OSRAM OLED GMBH, Regensburg (DE)

( * ) Notice: Subject to any disclaimer, the term of this patent is extended or adjusted under 35 U.S.C. 154(b) by 341 days.

(21) Appl. No.: 16/342,163

(22) PCT Filed: Oct. 23, 2017

(86) PCT No.: PCT/EP2017/077005
§ 371 (c)(1),
(2) Date: Apr. 15, 2019

(87) PCT Pub. No.: WO2018/077803
PCT Pub. Date: May 3, 2018

(65) Prior Publication Data
US 2019/0237615 A1 Aug. 1, 2019

(30) Foreign Application Priority Data
Oct. 26, 2016 (DE) .......................... 102016120419.6

(51) Int. Cl.
*H01L 33/02* (2010.01)
*H01L 31/0352* (2006.01)
(Continued)

(52) U.S. Cl.
CPC .... *H01L 33/025* (2013.01); *H01L 31/035236* (2013.01); *H01L 31/035263* (2013.01);
(Continued)

(58) Field of Classification Search
CPC ...................................................... H01L 33/02
See application file for complete search history.

(56) References Cited

U.S. PATENT DOCUMENTS

| 6,420,728 B1 | 7/2002 | Razeghi |
| 7,193,246 B1 | 3/2007 | Tanizawa et al. |

(Continued)

FOREIGN PATENT DOCUMENTS

| CN | 1292934 A | 4/2001 |
| CN | 1933199 A | 3/2007 |

(Continued)

*Primary Examiner* — Marvin Payen
(74) *Attorney, Agent, or Firm* — Slater Matsil, LLP

(57) ABSTRACT

A semiconductor body is disclosed. In an embodiment a semiconductor body includes an n-doped region comprising a first layer sequence comprising pairs of alternating layers, wherein a first layer and a second layer of each pair differ in their doping concentration, and wherein the first and second layers of each pair have the same material composition except for their doping and a second layer sequence comprising pairs of alternating layers, wherein a first layer and a second layer of each pair differ in their material composition, an active region, wherein the second layer sequence is disposed between the first layer sequence and the active region and a p-doped region, wherein the active region is disposed between the n-doped region and the p-doped region.

11 Claims, 2 Drawing Sheets

(51) Int. Cl.
*H01L 31/107* (2006.01)
*H01L 33/32* (2010.01)
*H02S 40/44* (2014.01)
*H01L 33/04* (2010.01)
*H01L 31/105* (2006.01)
*H01L 33/06* (2010.01)

(52) U.S. Cl.
CPC .......... *H01L 31/105* (2013.01); *H01L 31/107* (2013.01); *H01L 33/04* (2013.01); *H01L 33/06* (2013.01); *H01L 33/325* (2013.01); *H02S 40/44* (2014.12)

(56) References Cited

U.S. PATENT DOCUMENTS

| | | | |
|---|---|---|---|
| 8,173,991 B2 | 5/2012 | Stauss et al. | |
| 8,525,195 B2 | 9/2013 | Nago et al. | |
| 8,536,615 B1 | 9/2013 | Driscoll et al. | |
| 9,012,885 B2 | 4/2015 | Peter et al. | |
| 9,799,797 B2 | 10/2017 | Peter et al. | |
| 9,806,224 B2 | 10/2017 | Bergbauer et al. | |
| 2011/0006320 A1 | 1/2011 | Koo et al. | |
| 2012/0298964 A1* | 11/2012 | Peter | H01L 33/0093 257/28 |
| 2013/0043457 A1 | 2/2013 | Kang et al. | |

FOREIGN PATENT DOCUMENTS

| | | |
|---|---|---|
| CN | 102157648 A | 8/2011 |
| CN | 102687290 A | 9/2012 |
| CN | 104956498 A | 9/2015 |
| CN | 205092260 U | 3/2016 |
| JP | 2000244072 A | 9/2000 |
| JP | 2013516751 A | 5/2013 |
| JP | 2013183126 A | 9/2013 |
| JP | 2013187484 A | 9/2013 |
| JP | 2016072388 A | 5/2016 |
| KR | 20160046506 A | 4/2016 |
| WO | 0171811 A1 | 9/2001 |
| WO | 2009039830 A1 | 4/2009 |
| WO | 2009072787 A2 | 6/2009 |
| WO | 2011080249 A1 | 7/2011 |

\* cited by examiner

SEMICONDUCTOR BODY

This patent application is a national phase filing under section 371 of PCT/EP2017/077005, filed Oct. 23, 2017, which claims the priority of German patent application 102016120419.6, filed Oct. 26, 2016, each of which is incorporated herein by reference in its entirety.

TECHNICAL FIELD

A semiconductor body is specified.

SUMMARY OF THE INVENTION

Embodiments provide a semiconductor body that can be operated efficiently.

According to at least one embodiment of the semiconductor body, the semiconductor body comprises an n-doped region. The n-doped region is doped with at least one n-dopant. The n-doped region may comprise one or more n-doped semiconductor layers. The n-doped region be grown on a growth substrate and extend laterally over the entire growth substrate.

The lateral directions are those directions which are parallel to a main plane of the semiconductor body. The lateral directions are perpendicular to the vertical direction, which for example, is parallel to a stacking direction and/or a growth direction of the semiconductor body.

It is also possible that the growth substrate is removed from the n-doped region. In addition, the n-doped region can form a three-dimensional body, which can be cuboid or cylindrical, for example. It is possible that the n-doped region does not have a homogeneous doping concentration. This means that in some areas of the n-doped region, the doping concentration may be greater than in other areas of the n-doped region.

According to at least one embodiment, the semiconductor body comprises an active region. In the active region, a function of the semiconductor body is perceived during operation. For example, the active region may be designed to emit or detect electromagnetic radiation. The semiconductor body is then part of an optoelectronic component. The active region can then comprise, for example, a number of alternatingly arranged quantum well layers and barrier layers.

It is also possible that the semiconductor body is part of an electronic component such as a diode, a transistor or an integrated circuit. The active region is then appropriately designed.

The active region may have grown on the n-doped region and extend laterally on the n-doped region.

According to at least one embodiment, the semiconductor body comprises a p-doped region, wherein the active region is disposed between the n-doped and the p-doped region. The p-doped region is doped with at least one p-dopant. That the active region is disposed between the n-doped and p-doped regions may mean that the n-doped region, the active region and the p-doped region are superposed in the vertical direction. The p-doped region can therefore have been grown on the active region and extend laterally on the active region. The p-doped region can be formed by a p-doped semiconductor layer.

According to at least one embodiment of the semiconductor body, the n-doped region comprises a first layer sequence comprising pairs of alternating layers, wherein a first and a second layer of each pair differ in their doping concentration and the first and the second layer of each pair have the same material composition except for their doping. The first layer sequence therefore consists of a plurality of alternating first and second layers of the first layer sequence. The first and second layers of the first layer sequence are arranged one above the other in the vertical direction.

Either the dopant concentration of the first layer is greater than the dopant concentration of the second layer or the dopant concentration of the second layer is greater than the dopant concentration of the first layer. This can mean, for example, that the first layer is doped and the second layer is nominally undoped. "Nominally undoped" means here and in the following that no dopant is provided during the growth of the second layer. In this case, however, the second layer may have a dopant concentration caused by diffusion of the dopant from the first layer into the second layer.

According to at least one embodiment of the semiconductor body, the n-doped region comprises a second layer sequence comprising pairs of alternating layers, wherein a first and a second layer of each pair differ in their material composition. The second layer sequence therefore consists of a plurality of alternating first and second layers. These are arranged one above the other in the vertical direction. This means that the difference between the material compositions of the first and the second layer is not only given by their dopant concentration, but also by the materials through which they are formed apart from dopants. At least one layer of each pair of the second layer sequence can be doped n-conductively. It is also possible that all layers of the second layer sequence are n-doped.

In accordance with at least one embodiment of the semiconductor body, the second layer sequence is arranged between the first layer sequence and the active region. This means that the first layer sequence, the second layer sequence and the active region are arranged one above the other in the vertical direction. The second layer sequence can therefore be grown onto the first layer sequence and the active layer can be grown onto the second layer sequence.

The semiconductor body can be grown on a substrate. The semiconductor body can be epitaxially grown on a substrate by organometallic gas phase epitaxy. It is also possible that the semiconductor body is free of a growth substrate and is located on a carrier element which is subsequently attached to the semiconductor body after growth. Thus, the semiconductor body can be a thin film semiconductor body.

According to at least one embodiment of the semiconductor body, the semiconductor body comprises an n-doped region, an active region and a p-doped region. The active region is located between the n-doped and p-doped regions. The n-doped region comprises a first layer sequence comprising pairs of alternating layers, wherein a first and a second layer of each pair differ in their dopant concentration and the first and the second layer of each pair have the same material composition except for their doping. The n-doped region further comprises a second layer sequence comprising pairs of alternating layers, wherein a first and a second layer of each pair differ in their material composition. The second layer sequence is arranged between the first layer sequence and the active region.

The semiconductor body described here is based, among other things, on the knowledge that the first layer sequence of the semiconductor body forms a protection against electrostatic discharge. If the semiconductor body comprises the first layer sequence, the failure rate due to electrostatic charging of the semiconductor body is surprisingly strongly reduced. If the semiconductor body has the second layer sequence, also diffusion of dopants and other impurities into the active region can be prevented or reduced. In addition, the second layer sequence compensates for topographical irregularities in the underlying layers before the active region is grown onto the second layer sequence. The semiconductor body can be operated more efficiently by avoiding dopants and other impurities in the active region and by avoiding topographical unevenness before the growth of the active region.

According to at least one embodiment, the first layer of each pair of the first layer sequence is doped and the second layer of each pair of the first layer sequence is nominally undoped. A semiconductor body having the first layer sequence with the doped and undoped layers may have improved stability against electrostatic discharge compared to a semiconductor body having a layer sequence which is continuously doped. The failure rate during electrostatic discharge can thus be significantly reduced.

According to at least one embodiment, the semiconductor body is based on a nitride compound semiconductor material. This means in particular that at least some of the regions of the semiconductor body have or consist of a nitride compound semiconductor material, preferably $Al_nGa_mIn_{1-n-m}N$, where $0 \leq n \leq 1$, $0 \leq m \leq 1$ and $n+m \leq 1$. This material does not necessarily have to have a mathematically exact composition according to the above formula. Rather, it may, for example, contain one or more dopants and additional components. For simplicity's sake, however, the above formula contains only the essential components of the crystal lattice (Al, Ga, In, N), even if these may be partially replaced and/or supplemented by small quantities of other substances.

The n-doped region of the semiconductor body can be partially formed with n-doped gallium nitride (GaN). Silicon in particular is used as the n-dopant.

The active region can be formed, for example, with indium gallium nitride (InGaN) and GaN or indium gallium aluminum nitride (InGaAlN) and gallium aluminum nitride (GaAlN). Some of the layers in the active region may be n-doped. The p-doped region may be formed in particular with p-doped GaN.

The first and second layers of the first layer sequence can be formed with GaN. In each case, the first and second layers of the first layer sequence are formed with the same material except for the dopant concentration in the layers.

The first layer of the second layer sequence of the second layer sequence can be formed with InGaN and the second layer of the second layer sequence can be formed with GaN. It is also possible that the first layer of the second layer sequence is formed with GaN and that the second layer of the second layer sequence is formed with InGaN. In each case, the first and second layers of the second layer sequence are formed with different materials. The growth substrate of the semiconductor body can be formed, for example, by sapphire or silicon.

According to at least one embodiment, the n-doped region and the p-doped region are based on a nitride compound semiconductor material and the first layer sequence is nominally free of indium. This means that the doped first layers of the first layer sequence can in particular be formed by GaN. That the first layer sequence is nominally free of indium means that indium is not intentionally introduced during the growth of the first layer sequence. It is possible, however, that indium from other areas of the semiconductor body diffuses partially into the first layer sequence and is present there in very low concentrations. For example, the proportion of indium around semiconductor material of the first layer sequence is at most 5%, in particular at most 1%.

According to at least one embodiment, the active region is designed for the generation or detection of electromagnetic radiation, in particular light. The semiconductor body can, for example, be a light-emitting diode. For example, the light emitting diode can emit electromagnetic radiation in the ultraviolet, blue or green spectral range. It is also possible that the light emitting diode emits electromagnetic radiation in several of the spectral ranges mentioned.

According to at least one embodiment, an intermediate layer having a dopant concentration of at least $1 \times 10^{18}$ per $cm^3$ is arranged between the first layer sequence and the second layer sequence. The dopant, for example, can be silicon. If the intermediate layer has a higher dopant concentration than the first layer sequence or a dopant concentration at least as high as the n-doped layers of the first layer sequence, the active region can be better grown on the underlying layers. This may mean that the second layer sequence is mechanically and electrically in better contact with the first layer sequence and that the active region is mechanically and electrically in better contact with the second layer sequence. In other words, the intermediate layer can reduce an electrical contact resistance between the first and second layer sequences and the intermediate layer also serves as a mechanical connecting layer between the two layer sequences.

According to at least one embodiment, the intermediate layer is topographically flat. This means that the intermediate layer has a particularly low roughness, which is lower than the roughness without the intermediate layer. Since the intermediate layer is topographically flat, the active region, which is grown on the second layer sequence, can also be grown on a topographically flat surface. This allows the semiconductor body to be operated more efficiently.

According to at least one embodiment, the layer thickness of the first layer of the first layer sequence is at least 1 nm and not more than 30 nm and the layer thickness of the second layer of the first layer sequence is at least 30 nm and not more than 100 nm. This means that the layers have the specified layer thicknesses in the vertical direction. The preferred layer thickness of the first layer of the first layer sequence is at least 10 nm and at most 15 nm. The preferred layer thickness of the second layer of the first layer sequence is at least 40 nm and at most 60 nm. Due to the size of the layer thicknesses, diffusion of the dopants from the doped layers into the undoped layers may be reduced. Thus it is possible that the dopants essentially only diffuse into the border areas of the undoped layers, which border on the doped layers.

According to at least one embodiment, the number of pairs of the first layer sequence is at least 1 and at most 10. This means that the first layer sequence has at least one and at most ten first layers and has as many second as first layers. Preferably the number of pairs of the first layer sequence is at least three and at most five. Advantageously already with this small number of pairs of the first layer sequence a clearly increased stability against electrostatic discharge can be achieved. It is therefore possible to improve the stability against electrostatic discharge without significantly increasing the thickness of the semiconductor body.

According to at least one embodiment, the first layer of the first layer sequence has a maximum dopant concentration of $1 \times 10^{18}$ per $cm^3$. The first layer of the first layer sequence can, for example, be doped with silicon.

According to at least one embodiment, the layer thickness of the second layer sequence is less than or equal to 50 nm. The layer thickness of the first and second layers of the second layer sequence, for example, can be a maximum of 5 nm. The layer thickness of the first and second layers of the second layer sequence can preferably be at least 0.5 and at most 2 nm. A layer thickness of the second layer sequence of less than or equal to 50 nm enables to achieve a low forward voltage of the semiconductor body.

BRIEF DESCRIPTION OF THE DRAWINGS

In the following, the semiconductor bodies described here are explained in more detail in connection with an execution example and the corresponding figures.

Same, similar or seemingly similar elements are provided in the figures with the same reference signs. The figures and the proportions of the elements depicted in the figures are not to be regarded as true to scale. Rather, individual elements may be exaggeratedly large for better representability and/or better comprehensibility.

DETAILED DESCRIPTION OF ILLUSTRATIVE EMBODIMENTS

Figure 1:
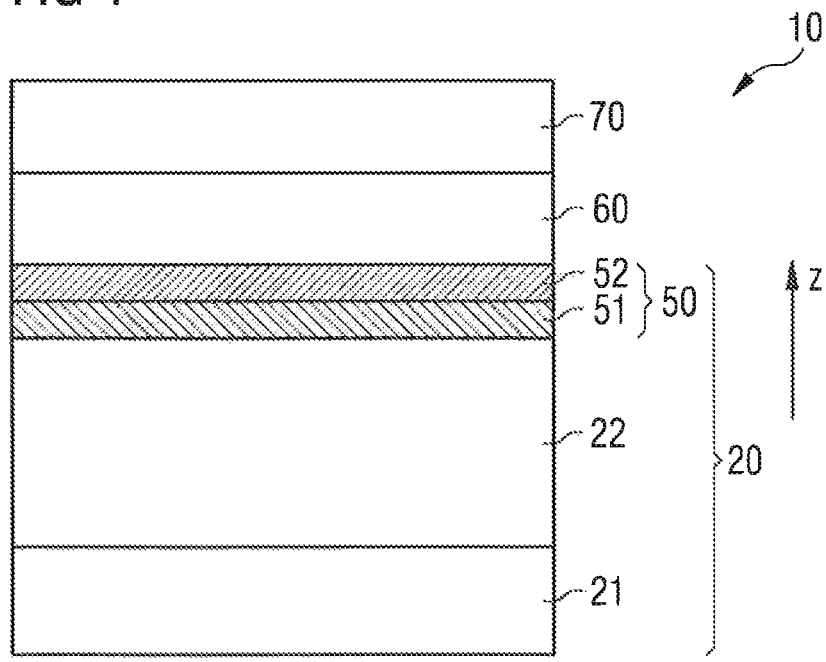
FIG. 1 shows a schematic cross-section through a semiconductor body.

FIG. 1 shows a schematic cross-section through a semiconductor body 10. The semiconductor body 10 has an n-doped region 20. The n-doped region 20 may be located on a growth substrate or a carrier element. The n-doped region 20 has an n-contact layer 21. In a vertical direction z, an n-doped intermediate layer 22 is arranged on the n-contact layer 21. The n-doped intermediate layer 22 and the n-contact layer 21 may be formed by n-doped GaN.

A second layer sequence 50 is arranged on the intermediate layer 22. The second layer sequence 50 consists of pairs of alternately arranged first and second layers 51, 52. In FIG. 1 only a representative first layer 51 and a representative second layer 52 of the second layer sequence 50 are shown. The second layer sequence 50 may comprise a plurality of alternating first and second layers 51, 52. The first layer 51 of the second layer sequence 50 can be formed with InGaN and the second layer 52 of the second layer sequence 50 with GaN. An active region 60 is arranged on the second layer sequence 50. A p-doped region 70 is arranged on the active region 60.

In the semiconductor body 10, which is shown in FIG. 1, the second layer sequence 50 prevents diffusion of dopants and other foreign atoms into the active region 60 and therefore the semiconductor body 10 can be operated more efficiently.

Figure 2:
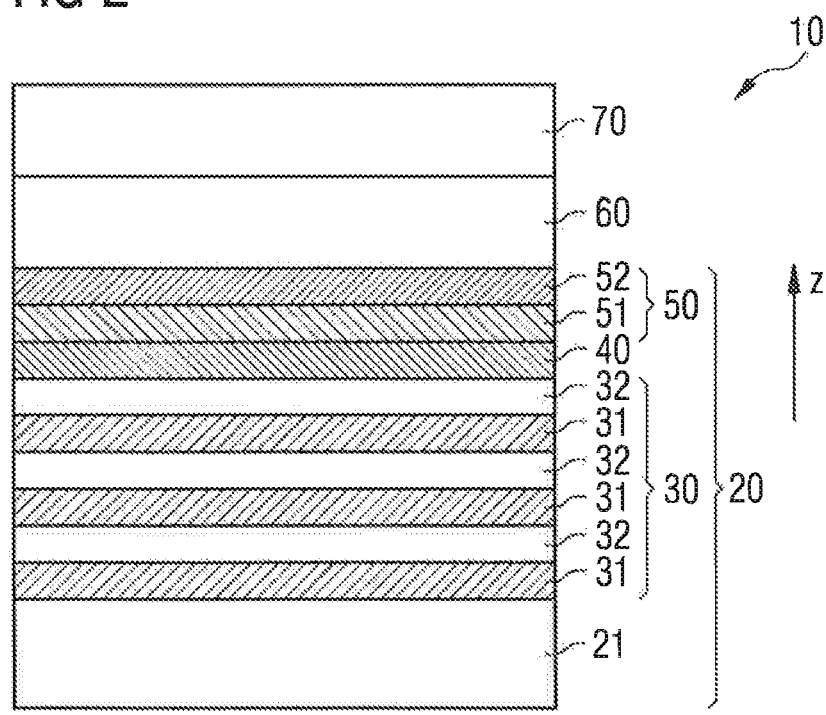
FIG. 2 shows a schematic cross-section through a semiconductor body according to an exemplary embodiment.

FIG. 2 shows a schematic cross-section through a semiconductor body 10 according to an exemplary embodiment. The semiconductor body 10 has an n-doped region 20 and a p-doped region 70. The n-doped region 20 has an n-contact layer 21.

In the vertical direction z, a first layer sequence 30 is arranged on the n-contact layer 21. The first layer sequence 30 comprises pairs of alternating first layers 31 and second layers 32. Therein the first layers 31 are n-doped with silicon and the second layers 32 are nominally undoped. This means that the second layers 32 are not intentionally doped, but it can happen that dopants from the first layers 31 diffuse into the second layers 32. The first layers 31 of the first layer sequence 30 have a maximum dopant concentration of $1*10^{18}$ $1/cm^3$. The first and second layers 31, 32 of each pair thus differ in their doping concentration and have the same material composition except for their doping. The n-contact layer 21 and the first layer sequence 30 can be formed with GaN. In this example, the first layer sequence 30 comprises three pairs of first and second layers 31, 32.

In the vertical direction z, an intermediate layer 40 is arranged on the first layer sequence 30. The intermediate layer 40 can be formed with GaN and n-doped with silicon with a dopant concentration of at least $1*10^{18}$ per $cm^3$. Due to the high dopant concentration of the intermediate layer 40, an active region 60 can be grown with improved quality and the stability of the semiconductor body against electrostatic discharge is increased.

A second layer sequence 50 is arranged on the intermediate layer 40. The second layer sequence 50 comprises pairs of alternately arranged first layers 51 and second layers 52. The first layers 51 of the second layer sequence 50 can be formed with InGaN and the second layers 52 of the second layer sequence 50 can be formed with GaN. The first and second layers 51, 52 of each pair thus differ in their material composition. In FIG. 2 only a representative first layer 51 and a representative second layer 52 of the second layer sequence 50 are shown. The second layer sequence 50 may comprise a plurality of alternating first and second layers 51, 52. The layer thickness of the second layer sequence 50 is less than or equal to 50 nm.

The active region 60 is applied to the second layer sequence 50. The second layer sequence 50 is thus arranged between the first layer sequence 30 and the active region 60. For example, the active region 60 may comprise a multiple quantum well structure comprising a plurality of alternating quantum well layers and barrier layers. The barrier layers can be formed with GaAlN or GaN and the quantum well layers can be formed with InAlGaN or InGaN. The p-doped region 70 is arranged on the active region 60. The active region 60 is thus arranged between the n-doped and the p-doped region 20, 70.

By introducing the first layer sequence 30 into the semiconductor body 10, the stability against electrostatic discharge of the semiconductor body 10 can be increased. By introducing the second layer sequence 50 into the semiconductor body 10, the semiconductor body 10 can be operated more efficiently, since the diffusion of dopants and other impurities into the active region 60 is prevented or reduced by the second layer sequence 50.

Figure 3:
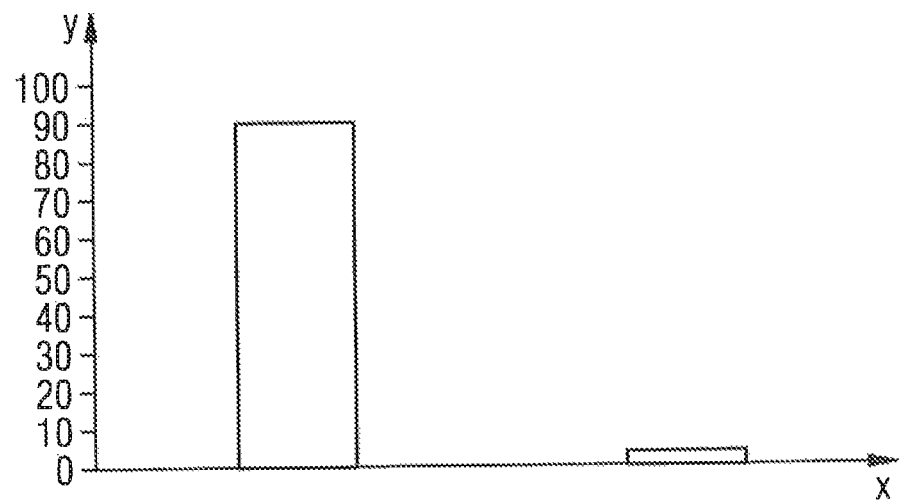
FIG. 3 shows the failure rate due to electrostatic charge for two semiconductor bodies.

FIG. 3 shows the electrostatic charge failure rate for the semiconductor body 10 shown in FIG. 1 and the semiconductor body 10 shown in FIG. 2. The failure rate in the 2 kV HBM (human body model)-test, i.e., at a discharge of 2 kV, is plotted on the y-axis. On the x-axis, the failure rate for the semiconductor body 10 shown in FIG. 1 is shown on the left and the failure rate for the semiconductor body 10 shown in FIG. 2 is shown on the right. For the semiconductor body 10 in FIG. 1, the failure rate is about 90 percent. In contrast, the failure rate for the semiconductor body 10 in FIG. 2 is less than 10 percent. A difference between the semiconductor bodies 10 in FIGS. 1 and 2 is that the semiconductor body 10 in FIG. 2 has the first layer sequence 30 in addition to the second layer sequence 50. By introducing the first layer sequence 30, the failure rate during electrostatic discharge can thus be surprisingly significantly reduced.

Figure 4:
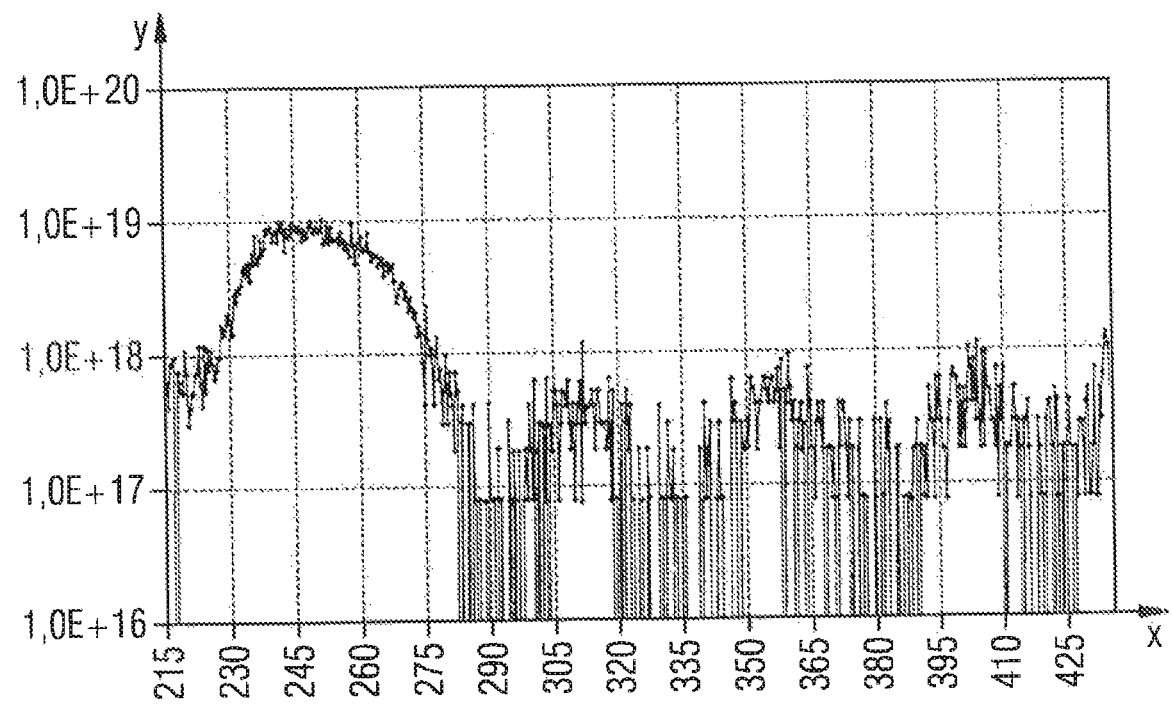
FIG. 4 shows the dopant concentration of different layers of a semiconductor body.

FIG. 4 shows the dopant concentration of different layers of a sample semiconductor body 10 as shown in FIG. 2. The dopant concentration was determined by secondary ion mass spectroscopy. On the y-axis the dopant concentration in per cm³ is plotted and on the x-axis the depth from which the secondary ions are detected is plotted in nm. A depth of 0 nm corresponds to the surface of the semiconductor body 10. The peak around 250 nm refers to the intermediate layer 40. Said intermediate layer has a dopant concentration of about $1*10^{19}$ 1/cm³. Between about 290 nm and 430 nm depth, the first layer sequence 30 is located. Due to the small layer thicknesses of the first and second layers 31, 32 of the first layer sequence 30, these cannot be assigned in the spectrum. It can be seen that the first layer sequence 30 has a lower dopant concentration than the intermediate layer 40.

The invention is not limited by the description using the exemplary embodiments to these. Rather, the invention includes any new feature and any combination of features, which in particular includes any combination of features in the patent claims, even if that feature or combination itself is not explicitly mentioned in the patent claims or execution examples.

The invention claimed is:

1. A semiconductor body comprising:
   an n-doped region comprising:
      a first layer sequence comprising pairs of alternating layers, wherein a first and a second layer of each pair differ in their doping concentration, and wherein the first and second layers of each pair have the same material composition except for their doping; and
      a second layer sequence comprising pairs of alternating layers, wherein a first layer and a second layer of each pair differ in their material composition;
   an active region, wherein the second layer sequence is disposed between the first layer sequence and the active region; and
   a p-doped region,
   wherein the active region is disposed between the n-doped region and the p-doped region.

2. The semiconductor body according to claim 1, wherein a number of pairs of the first layer sequence is at least three and at most five.

3. The semiconductor body according to claim 1, wherein the first layer of each pair of the first layer sequence is doped and the second layer of each pair of the first layer sequence is undoped.

4. The semiconductor body according to claim 1, wherein the n-doped region and the p-doped region are based on a nitride compound semiconductor material and the first layer sequence of the n-doped region is free of indium.

5. The semiconductor body in accordance with claim 1, wherein the active region is configured to generate or detect electromagnetic radiation.

6. The semiconductor body according to claim 1, further comprising an intermediate layer having a dopant concentration of at least $1*10^{18}$ 1/cm³ between the first layer sequence and the second layer sequence.

7. The semiconductor body according to claim 6, wherein the intermediate layer is topographically flat.

8. The semiconductor body according to claim 1, wherein a layer thickness of the first layer of the first layer sequence is at least 1 nm and at most 30 nm, and wherein a layer thickness of the second layer of the first layer sequence is at least 30 nm and at most 100 nm.

9. The semiconductor body according to claim 1, wherein a number of pairs of the first layer sequence is at least 1 and at most 10.

10. The semiconductor body according to claim 1, wherein the first layer of the first layer sequence has a dopant concentration of at most $1*10^{18}$ 1/cm³.

11. The semiconductor body according to claim 1, wherein a layer thickness of the second layer sequence is less than or equal to 50 nm.

* * * * *